United States Patent
Paxton et al.

(10) Patent No.: US 7,906,270 B2
(45) Date of Patent: Mar. 15, 2011

(54) REDUCED PITCH MULTIPLE EXPOSURE PROCESS

(75) Inventors: Theodore A Paxton, Chandler, AZ (US); Todd J Davis, Tempe, AZ (US); Todd D. Hiar, Gilbert, AZ (US); Cassandra May Owen, Chandler, AZ (US); Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 719 days.

(21) Appl. No.: 11/086,664

(22) Filed: Mar. 23, 2005

(65) Prior Publication Data
US 2006/0216649 A1  Sep. 28, 2006

(51) Int. Cl.
*G03F 7/20* (2006.01)

(52) U.S. Cl. ........................ 430/311; 430/394

(58) Field of Classification Search .......... 430/311, 430/394
See application file for complete search history.

(56) References Cited

U.S. PATENT DOCUMENTS

| | | | | |
|---|---|---|---|---|
| 5,902,716 A | * | 5/1999 | Owa et al. ........... | 430/312 |
| 2002/0195419 A1 | * | 12/2002 | Pavelchek .......... | 216/16 |
| 2003/0008245 A1 | * | 1/2003 | Iwasaki et al. ....... | 430/321 |
| 2003/0129531 A1 | * | 7/2003 | Oberlander et al. ..... | 430/271.1 |
| 2004/0005507 A1 | * | 1/2004 | Lakkapragada et al. ..... | 430/30 |
| 2005/0175937 A1 | * | 8/2005 | Bae ................... | 430/312 |

FOREIGN PATENT DOCUMENTS

| | | |
|---|---|---|
| JP | 61-174718 A | 8/1986 |
| JP | 02-262319 A | 10/1990 |
| JP | 04-071222 A | 3/1992 |
| JP | 08-250395 A | 9/1996 |
| JP | 11-072925 A | 3/1999 |
| JP | 2002-367877 A | 12/2002 |

OTHER PUBLICATIONS

Notice of Reasons for Rejection for Japanese Patent Application No. 2006-114997 dated Jun. 1, 2009.

* cited by examiner

*Primary Examiner* — Kathleen Duda
*Assistant Examiner* — Brittany Raymond
(74) *Attorney, Agent, or Firm* — Pillsbury Winthrop Shaw Pittman LLP (57) ABSTRACT

A lithographic method to enhance image resolution in a lithographic cluster using multiple projections and a lithographic cluster used to project multiple patterns to form images that are combined to form a patterned image having enhanced resolution.

31 Claims, 5 Drawing Sheets

REDUCED PITCH MULTIPLE EXPOSURE PROCESS

BACKGROUND OF THE INVENTION

1. Field of the Invention

The present invention relates to a lithographic cluster and a method of making a device and enhancing image resolution in a lithographic cluster.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Development of new apparatus and methods in lithography have led to improvements in resolution of the imaged features, such as lines and contact holes or vias, patterned on a substrate, possibly leading to a resolution of less than 50 nm. This may be accomplished, for example, using relatively high numerical aperture (NA) projection systems (greater than 0.75 NA), a wavelength of 193 nm or less, and a plethora of techniques such as phase shift masks, non-conventional illumination and advanced photoresist processes.

However, certain small features such as contact holes are especially difficult to fabricate. The success of manufacturing processes at sub-wavelength resolutions will rely on the ability to print low modulation images or the ability to increase the image modulation to a level that will give acceptable lithographic yield.

Typically, the industry has used the Rayleigh criterion to evaluate the critical dimension (CD) and depth of focus (DOF) capability of a process. The CD and DOF measures can be given by the following equations:

$$CD = k_1(\lambda/NA),$$

and $$DOF = k_2(\lambda/NA^2),$$

where $\lambda$ is the wavelength of the illumination radiation, $k_1$ and $k_2$ are constants for a specific lithographic process, and NA is the numerical aperture.

Additional measures that provide insight into the difficulties associated with lithography at the resolution limit include the Exposure Latitude (EL), the Dense:Isolated Bias (DIB) (also known as iso-dense bias), and the Mask Error Enhancement Factor (MEEF). The exposure latitude describes the percentage dose range where the printed pattern's critical dimension (CD) is within acceptable limits. For example, the exposure latitude may be defined as the change in exposure dose that causes a 10% change in printed line width. Exposure Latitude is a measure of reliability in printing features in lithography. It is used along with the DOF to determine the process window, i.e., the regions of focus and exposure that keep the final resist profile within prescribed specifications. Dense:Isolated Bias (also known as iso-dense bias) is a measure of the size difference between similar features, depending on the pattern density. Finally, the MEEF describes how patterning device CD errors are transmitted into substrate CD errors.

Among the trends in lithography is to reduce the CD by lowering the wavelength used, increasing the numerical aperture, and/or reducing the value of k1. However, increasing the numerical aperture would also lead to a decrease in the DOF which ultimately could lead to limitations in process latitude. This can also be understood by combining the above two equations to obtain:

$$DOF = (k_2/k_1^2)(CD^2/\lambda).$$

From this equation it can be seen that a decrease in CD, i.e., an increase in resolution, would lead to a decrease in DOF which is unwanted in most lithographic processes and specifically in the process of printing contact holes.

In a simplified approximation of coherent illumination, the resolution of a lithography system is also conventionally quoted in terms of the smallest half-pitch of a grating that is resolvable as a function of wavelength and numerical aperture NA. For conventional optical lithography, the ultimate resolution limit is reached at $k_1 = 0.5$. Imaging with properties similar to a two-beam interference system allows to extend the ultimate resolution limit to the $k_1 = 0.25$ level.

SUMMARY OF THE INVENTION

According to an aspect of the present invention, there is provided a method for enhancing image resolution in a lithographic cluster. The method includes coating a surface of substrate with a developable material layer, coating a first resist layer on top of the developable material layer and projecting a first pattern onto an area of the substrate coated with the developable material layer and the first resist layer. The method further includes coating a second resist layer on top of the developable material layer, and projecting a second pattern onto an area of the substrate coated with the developable material layer and the second resist layer. Projecting the first pattern and projecting the second pattern produces a desired patterned image on the developable material layer.

According to another aspect of the present invention there is provided a method for manufacturing a device. The method includes projecting a first pattern onto an area of a substrate coated with a developable material layer and a first resist layer and projecting a second pattern onto an area of the substrate coated with the developable material layer and a second resist layer, wherein projecting the first pattern and projecting the second pattern produces a desired patterned image on the developable material layer.

According to yet another aspect of the present invention, there is provided a lithographic cluster including a coating station configured to apply a developable material layer onto a substrate and to apply a first and a second resist layer on top of the developable material layer and a projection apparatus configured to project a first pattern of a first patterning device onto the substrate and to project a second pattern of a second patterning device onto the substrate. The first pattern and the second pattern are combined to produce a desired patterned image on the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may be referred to below, collectively or singularly, as a "lens."

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

These and other aspects of the invention will become more apparent and more readily appreciated from the following detailed description of the present exemplary embodiments of the invention, taken in conjunction with the accompanying drawings, of which.

DETAILED DESCRIPTION OF THE EMBODIMENT

Figure 1:
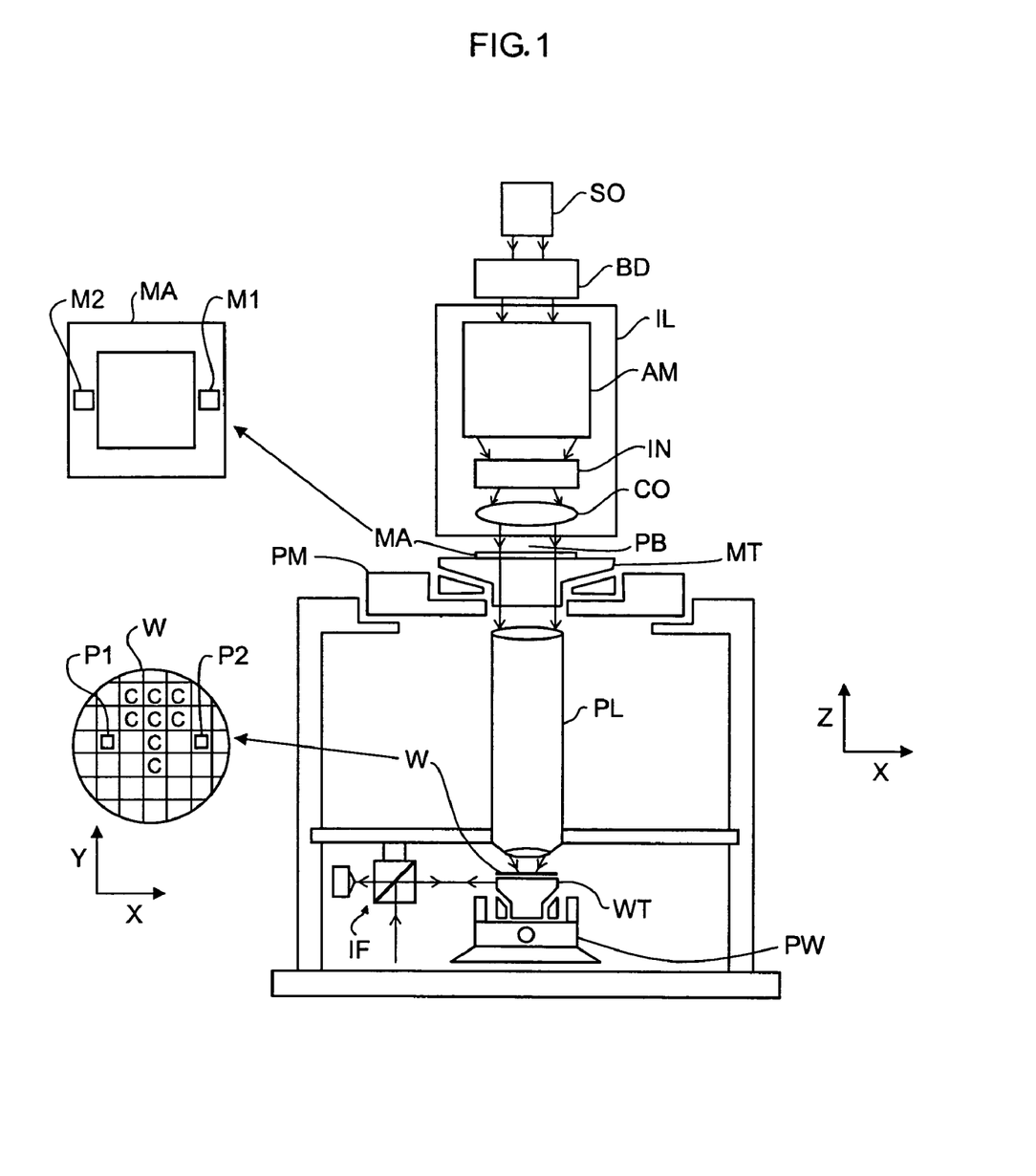
FIG. 1 schematically depicts a lithographic projection apparatus according to an embodiment of the invention.

FIG. 1 schematically depicts a lithographic apparatus according to a particular embodiment of the invention. The apparatus includes:

an illumination system (illuminator) IL adapted to condition a beam PB of radiation (e.g., UV radiation);

a support structure (e.g., a mask table) MT configured to hold a patterning device (e.g., a mask) MA and connected to first positioning device PM configured to accurately position the patterning device with respect to item PL;

a substrate table (e.g., a wafer table) WT configured to hold a substrate (e.g., a resist-coated wafer) W and connected to second positioning device PW configured to accurately position the substrate with respect to item PL; and a projection system (e.g., a refractive projection lens) PL adapted to image a pattern imparted to the beam PB by the patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the projection system PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the support structure MT and the substrate table WT will be realized with the aid of a long-stroke module (coarse positioning) and a short-stroke module (fine positioning), which form part of the one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. The depicted apparatus can be used in the following preferred modes:

1. In step mode, the support structure MT and the substrate table WT are kept essentially stationary, while an entire pattern imparted to the projection beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A need exits to achieve finer optical resolutions and circumvent the theoretical half-pitch lower limit $k_1$ of 0.25 as this would allow printing smaller and more densely spaced features without resorting to expensive technologies that employ shorter wavelengths and/or higher numerical apertures.

Figure 2:
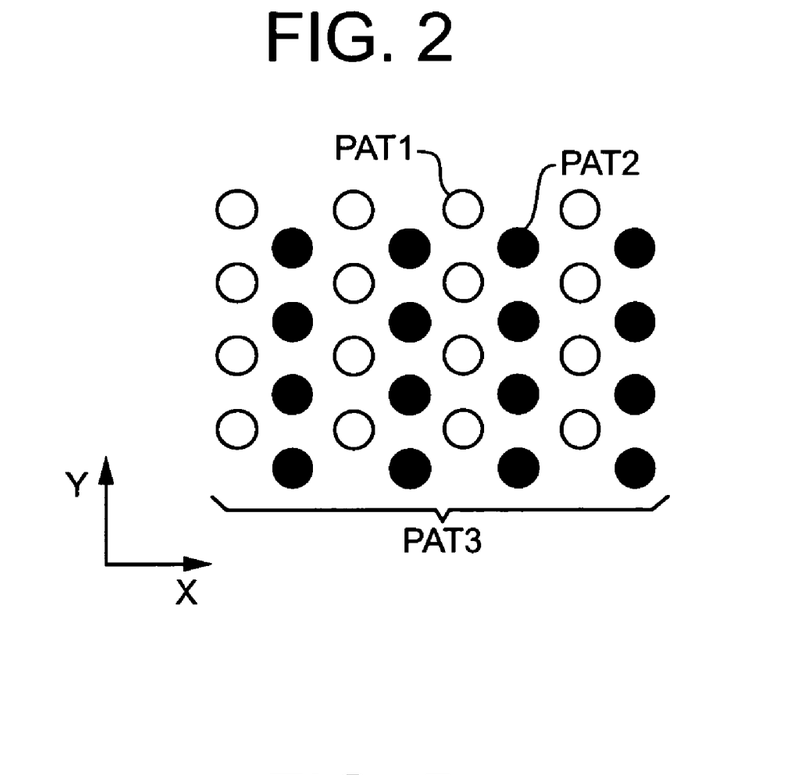
FIG. 2 depicts a typical example of a multiple exposure approach, using two exposures, according to an embodiment of the present invention.

One approach to lowering k1 is by using a double exposure to expose two complementary images that individually are less difficult to print but when imaged on the same substrate they produce a combined image that would have been more difficult to print otherwise. FIG. 2 illustrates a typical example of this approach in which a pattern PAT1 with a larger pitch, shown in FIG. 2 as features represented by blank filled circles, is exposed (first exposure) and projected onto a substrate (not shown). The substrate is shifted and a second pattern PAT2, shown in FIG. 2 as features represented as gray filled circles, is exposed (second exposure) and projected onto the same substrate so that the features of the second pattern PAT2 fit between the features of the first pattern PAT1. The two patterns PAT1 and PAT2 are thus combined, interleaved, or otherwise superimposed, to obtain a pattern PAT3 which is more densely spaced than patterns PAT1 and PAT2 taken separately. The second pattern PAT2 can be a same pattern as the first pattern PAT1 or a different pattern. In other words, the period between the features of the first pattern PAT1 and the period between the features of the second pattern PAT2, in X and/or Y directions, can be the same or different. In addition, features of the first pattern and features of the second pattern can be the same (for example, contact holes with a same diameter) or different features (for example, contact holes with different diameters).

This double exposure technique can be used to print patterns that are much more densely spaced allowing imaging below a k1 value of 0.25. However, printing with a double exposure on a same resist (on a same substrate) may be difficult as cross-talk between the two images of patterns PAT1 and PAT2 may occur which may lead to deterioration of resolution. To prevent cross-talk between the images of the first pattern PAT1 and the second pattern PAT2, the images are transferred or held within the substrate.

However, transferring the images to the same substrate requires extremely aggressive overlay specifications and additional process steps. The most common implementation of this double exposure technique requires etching and cleaning the substrate between the first and second exposures. The etch and clean steps are additional steps that may introduce a delay of 24 hours to 48 hours between the first and second exposures. The additional steps may also introduce additional difficulties in the lithographic process. The relatively long period between the two exposures may impact the overlay performance of the lithographic apparatus and may affect the imaging stability of the lithographic apparatus and the coat/develop track that is typically linked to the lithographic apparatus which together are commonly referred to as a lithographic cluster.

Furthermore, the additional process steps may be required to be performed outside the lithographic cluster, i.e., outside the lithographic apparatus and/or outside the coat/develop track, which may involve additional labor and thus add cost to the overall process. In addition, the additional process steps may also increase tracking requirements to insure that the second exposure is performed on the same lithographic apparatus so as to maintain the tightest possible overlay and imaging performance. All these and other limitations may reduce to a certain extent the performance of the lithographic process.

To eliminate the need for the additional process steps (e.g., etch and clean steps) currently used to implement reduced pitch double exposure, a developable material layer is applied on a surface of the substrate prior to applying the resist layer onto the substrate. In an embodiment of the invention, the developable material is a developable Bottom Anti-Reflective Coating (BARC) and/or a wet developable material. A suitable developable BARC material may be, for example, IMBARC™, a coating manufactured by Brewer Science, Inc, or D-BARC™, a coating manufactured by Clariant Corporation. By using the developable material layer, e.g., the developable material, the substrate is kept within the lithography cluster, i.e., inside the lithographic apparatus and/or the coat/develop track, during the full cycle of the double exposure (first and second exposure). As a result, any time delay that may occur between the first and second exposures can be significantly reduced. In addition, the use of this developable material layer can be extended beyond two exposures to include many exposures.

Figure 3:
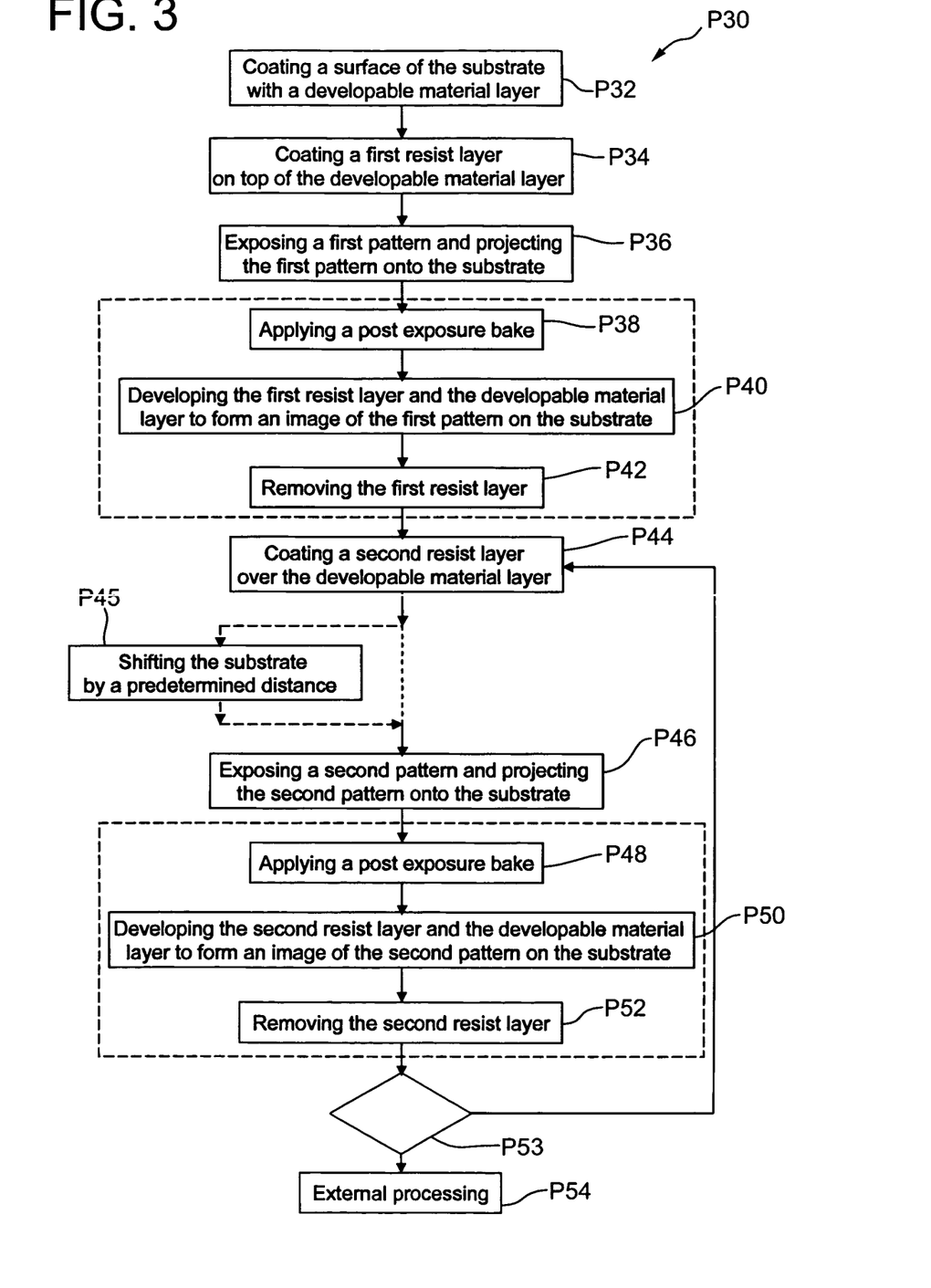
FIG. 3 shows a flow diagram of a lithographic process according to an embodiment of the present invention.

FIG. 3 shows a flow diagram of a lithographic process according to an embodiment of the present invention. The lithographic process (P30) includes, coating a surface of a substrate with a developable layer (P32) and coating a first resist layer on top of the developable layer (P34). The lithographic process (P30) further includes exposing a first pattern and projecting the first pattern onto the substrate coated with the developable layer and the first resist layer (P36), applying a post exposure bake (P38) and developing the first resist layer and developable layer to form an image of the first pattern on the substrate (P40).

The lithographic process (P30) proceeds by removing the first resist layer, for example with wet processing, while the imaged developable material carrying the first pattern is maintained on the substrate (P42). The removal of the first resist layer is followed by coating a second resist layer over the imaged wet developable layer (P44). In an embodiment of the invention, removing the first resist layer (P42) and coating the second resist layer (P44) are carried out in a same area within the coat/develop track (e.g., a coating bowl).

The lithographic process (P30) further includes exposing a second pattern and projecting the second pattern onto the substrate coated with the developable material layer and the second resist layer (P46), applying a post exposure bake (P48) and developing the second resist layer and the developable material layer to form an image with the second pattern on the substrate (P50). The lithographic process proceeds by removing the second resist layer, for example with wet processing, while the imaged developable material layer carrying the first and second patterns is maintained (P52). At point (P53), the substrate can be, for example, coated with a third resist layer and the processes (P44 and following processes) repeated via a loop in the lithographic process (P30), or the substrate can be released for further post lithographic processing (P54). This process loop of applying a third resist layer and possibly a plurality of subsequent resist layers can be repeated as desired to achieve a desired image quality and/or resolution. As previously stated, the second pattern can be the same pattern as the first pattern or different from the first pattern. In the case that the second pattern is merely a shifted version of the first, or otherwise requires and offset, prior to projecting the second pattern, the substrate is shifted or offset by a predetermined distance D in the X and/or Y directions (P45). The predetermined distance D corresponds to the shift required to adequately image the features of the second pattern on the second resist layer and developable material layer in order to superimpose or interleave the second pattern features in between the features of the already imaged first pattern on the developable material layer so as to render the desired target pattern.

The following paragraphs describe the state of the substrate after the process steps described above are carried out. FIGS. 4A-4G depict a status of a processed substrate after performing the steps of the lithographic process described above.

Figure 4A:
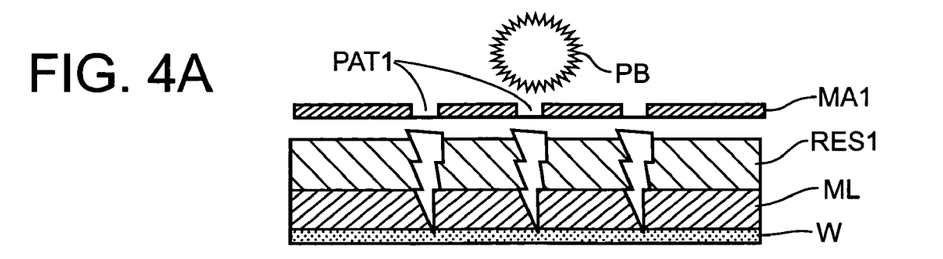
FIGS. 4A-4G depict the state of the substrate after performing various steps of the process shown in FIG. 3.

FIG. 4A shows a substrate W having a surface coated with a developable material layer ML. A first resist layer RES1 is coated over the developable material layer ML. The substrate W with developable material layer ML and resist layer RES1 is exposed to a patterned radiation generated by projecting radiation PB through a mask MA1 having a first pattern PAT1.

Figure 4B:
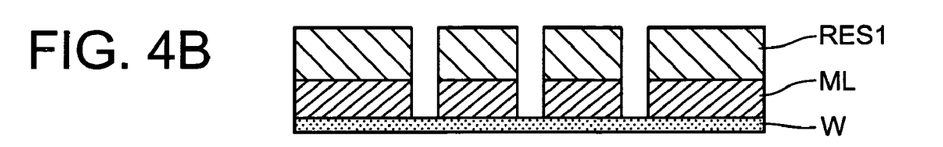

FIG. 4B shows the substrate W with the developable material layer ML and resist layer RES1 both carrying the first pattern PAT1 (after development of the developable material layer ML and the first resist layer). The developable material layer ML and first resist layer RES1 are developed and the exposed areas of the developable material layer ML and the first resist layer RES1 are removed in the case of a positive resist process. In the case of a negative resist process, unexposed areas in the developable material layer ML and the resist layer RES1 are removed. Features corresponding to the first pattern PAT1 are formed in both the first resist layer RES1 and the developable material layer ML. The features may be voids (as shown in FIG. 4B) in the case of a positive resist process or "peaks" in the case of a negative resist process. In both cases, this results in the first pattern PAT1 being transferred into the resist layer RES1 and the developable material layer ML.

Figure 4C:
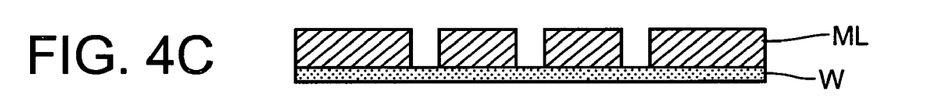

FIG. 4C shows the substrate after removal or stripping of the first resist layer RES1 but with the developable material layer ML carrying the first pattern PAT1 remaining. The first resist layer RES1 is removed while the developable material layer ML carrying the first pattern PAT1 is maintained on the substrate W.

Figure 4D:
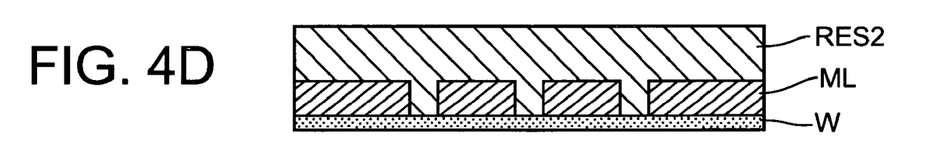

FIG. 4D shows the substrate coated with a second resist layer RES2. The second resist layer is coated over the developable material layer ML carrying the first pattern PAT1. As a result, voids in the developable material layer ML corresponding to the first pattern PAT1 are filled with the resist material. Although FIG. 4D shows a substrate on which a positive resist process is applied, it must be appreciated that the process discussed herein may be applied to a negative resist process. In a negative resist process (with associated negative developable material), the second resist layer is coated over the developable material layer ML to fill the voids corresponding to complements of the "peak" features.

Figure 4E:
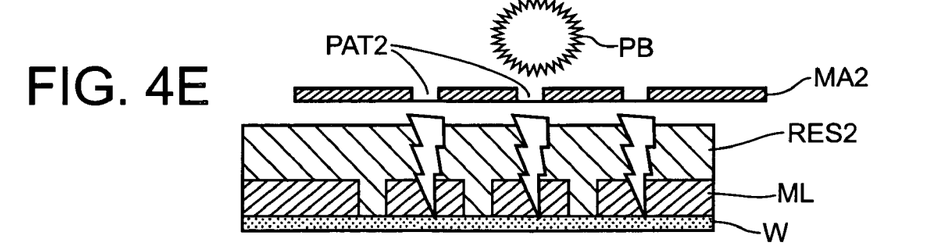

FIG. 4E shows the substrate W with a surface coated with the developable material layer ML and the second resist layer RES2. The substrate W with developable material layer ML and exposed areas of resist layer RES2 is exposed to a patterned radiation generated by projecting radiation PB through a mask MA2 having a second pattern PAT2. The second pattern PAT2 can be the same as the first pattern PAT1 or different from the first pattern PAT1. In an embodiment of the invention, prior to projecting the second pattern PAT2, the substrate W is shifted or offset by a predetermined distance D in the X and/or Y directions. The predetermined distance D corresponds to the shift required to adequately image the features of the second pattern PAT2 on the resist layer RES2 and developable material layer ML in order to superimpose the second pattern PAT2 features in between the features of the already-imaged first pattern PAT1 so as to render the desired target.

Figure 4F:
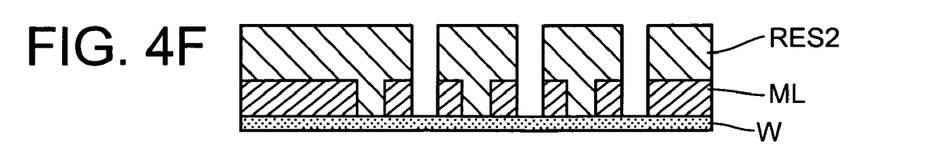

FIG. 4F shows the substrate W after the developable material layer ML and resist layer RES2, both carrying the second pattern PAT2, are developed by removing the exposed areas of the developable material layer ML and the resist layer RES2, in the case of a positive resist process or by removing unexposed areas in the developable material layer ML and the resist layer RES2 in the case of a negative resist process. Features corresponding to the second pattern PAT2 are formed in both the second resist layer RES2 and the developable material layer ML. The features may be voids (as shown in FIG. 4F) in the case of a positive resist process or "peaks" in the case of a negative resist process (not shown). In this way, the second pattern PAT2 is transferred into the resist layer RES2 and the developable material layer ML.

Figure 4G:
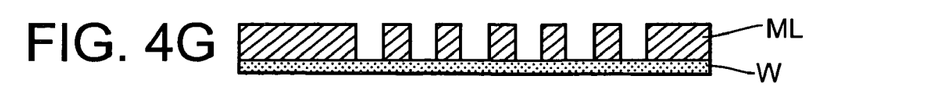

FIG. 4G shows the substrate after removal of the second resist layer RES2. The second resist layer RES2 is removed while the developable material layer ML carrying both the first and the second patterns is maintained on the substrate W. The obtained substrate W with the developable material layer ML carries the desired pattern which is a combination of the first pattern PAT1 and second pattern PAT2. The obtained substrate is thus prepared for further processing which may include, additional repetitions of the lithographic process described or for example, etching, ion-implantation (doping), metallization, oxidation, chemical, mechanical polishing, etc.

Figure 5:
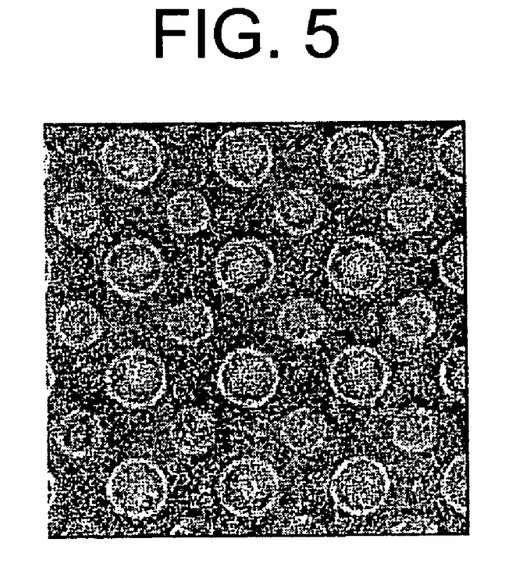
FIG. 5 shows a scanning electron microscope photograph of a plurality of contact holes damaged in a developable material using the process shown in FIG. 3.

FIG. 5 shows a Scanning Electron Microscope (SEM) photograph of a plurality of contact holes imaged in a developable material using the process described herein. In this example, the second pattern is different from the first pattern. Specifically, the diameter of the contact holes of the first pattern is smaller than the diameter of the holes of the second pattern. This is done merely for easily distinguishing between the contact holes imaged with the first pattern and contact holes imaged with the second pattern. It should be appreciated that any combination of patterns can be imaged using the process described herein. This example demonstrates that the process discussed herein can be used to print patterns that are much more densely spaced than would have been possible by only using one pattern, thus allowing imaging below a k1 value of 0.25.

Figure 6:
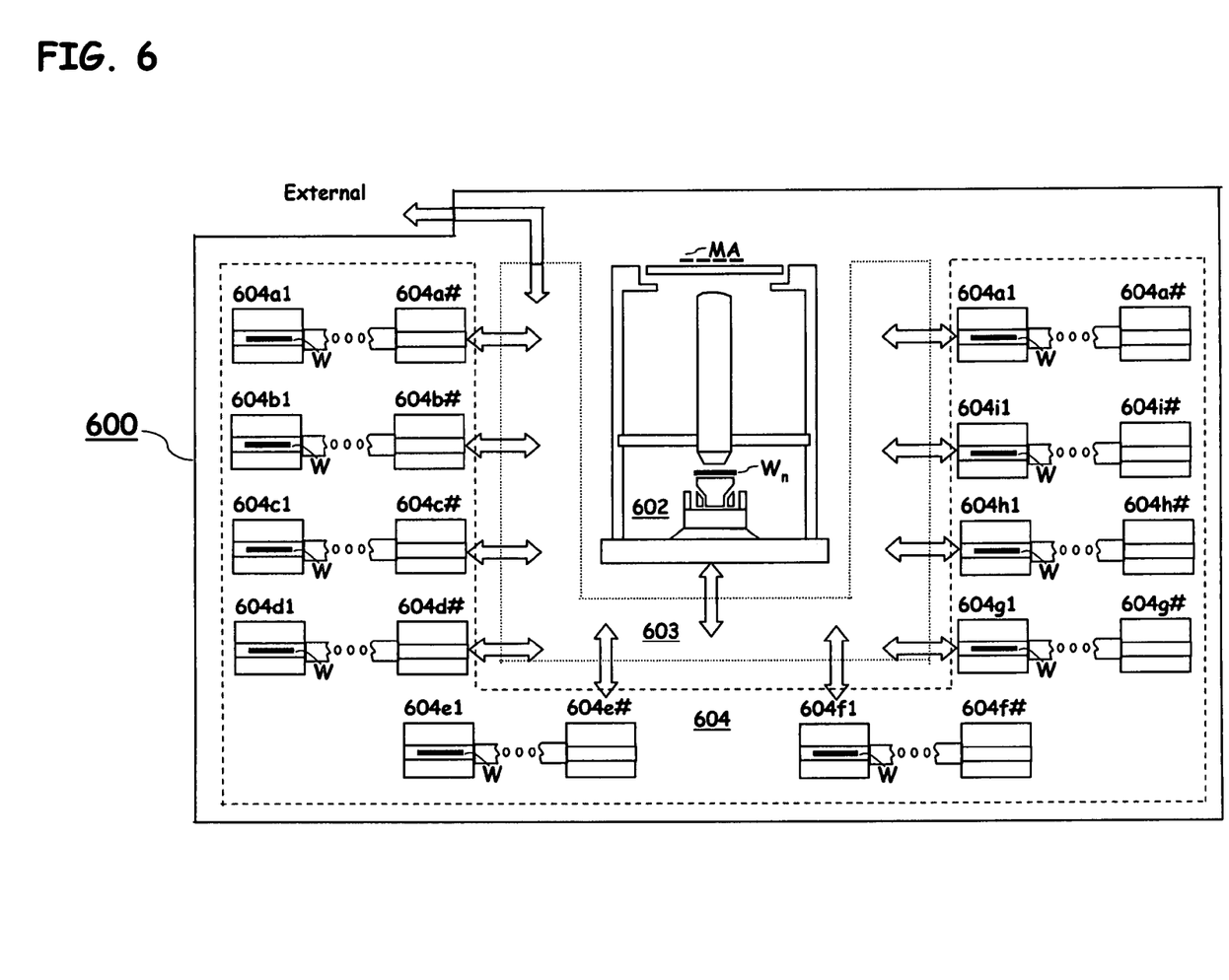
FIG. 6 shows a schematic diagram of a lithographic system according to an embodiment of the present invention.

FIG. 6 schematically depicts an integrated lithographic fabrication cluster system constructed and operative in accordance with a particular embodiment of the present invention. As illustrated, lithographic cluster 600 includes lithographic exposure apparatus 602, substrate handling apparatus 603, and coat/develop track apparatus 604.

Lithographic exposure apparatus 602 is configured to project a first pattern of a first patterning device onto the substrate and to project additional patterns of an additional patterning devices onto the substrate. An example of lithographic projection apparatus 602 is depicted in FIG. 1 and is described in detail in the previous paragraphs.

Coat/develop track apparatus 604 is configured to perform pre-exposure processes including, but not limited to, priming, anti-reflective coating, wet developable material coating, resist coating, soft bake processes, and measurement processes. Coat/develop track apparatus 604 is also configured to perform post exposure processes including, but not limited to, post exposure bake (PEB), development, resist removal, and measurement processes. In performing these pre- and post-exposure processes, a number of processing stations or modules $604_{a1}$-$604_{k1}$ are incorporated within the wafer track apparatus 604. These processing modules $604_{a1}$-$604_{k1}$ may include Chill Plates, Bake Plates, Coater modules, Developer modules, Priming modules, Resist removal modules (Resist stripping modules), and Metrology modules. Multiple modules of any given type $604_{a1}$-$604_{a\#}$ may be included within wafer track apparatus 604 to increase throughput. In an embodiment of the invention the coat/develop track apparatus 604 is configured to deposit the wet developable material and resist material to the substrate prior to exposure as many times as required. The coat/develop track apparatus 604 is also configured to perform post exposure substrate processing including, post exposure bake, develop, hard bake, and resist removal processes as many times as required.

Substrate handling apparatus 603 is configured to transport the wafer substrates W, in a pre-specified order, between processing modules $604_{a1}$-$604_{k1}$ of coat/develop apparatus 604 and exposure apparatus 602. Substrate handling apparatus 603 may include robotic, conveyor, or track mechanisms or combinations there from to support the delivery and/or retrieval of wafer substrates from processing modules $604_{a1}$-$604_{k1}$. Because coat/develop apparatus 604 includes a number of processing modules $204_{a1}$-$204_{k\#}$, all of these modules require the support of substrate handling apparatus 603 to load and unload the substrates W from the individual modules.

In an embodiment of the invention, for example, the substrate is coated with the developable material, baked, chilled, coated with the resist material, baked, and chilled within the coat/develop apparatus 604 and then transferred to the lithographic exposure apparatus 602. The substrate including the first process layer is exposed within the lithographic exposure apparatus 602 and transferred to the coat/develop apparatus 604 for post exposure processing. The coat/develop apparatus 604 applies a post exposure bake, develop the first resist layer, and remove the first resist layer. During this process all substrate handling and transportation is performed by the substrate handling apparatus 603. After processing the substrate in this way, the substrate may then be maintained within the coat/develop apparatus 604 and returned to the coating station, for example, to apply a second resist layer on top of the material layer (for example a developable material layer). The process of exposure in lithographic apparatus 602 is repeated and the substrate is returned to the coat/develop apparatus 604 for post exposure processing including post exposure bake, develop, and resist removal, before sending the substrate for further processing within the lithographic cluster or for further external process as indicated schematically by the arrow to external.

Since numerous modifications and changes will readily occur to those of skill in the art, it is not desired to limit the invention to the exact construction and operation described herein. For example, while developable material is discussed herein as a suitable material to apply on the substrate before applying a first resist layer or a second resist layer, it should be appreciated that other materials and/or configurations, for example using a negative resist process, are also contemplated.

Moreover, the process, method and apparatus of the present invention, like related apparatus and processes used in the lithographic arts, tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A method for enhancing image resolution in a lithographic cluster, comprising:
   projecting a first pattern onto an area of a substrate coated with a developable material layer and a first resist layer on top of the developable material layer;
   coating a second resist layer on top of the developable material layer, wherein material of or on the substrate immediately beneath the first resist layer and the developable material layer is not etched between coating the first resist layer and coating the second resist layer; and
   projecting a second pattern onto an area of the substrate coated with the developable material layer and the second resist layer,
   wherein projecting the first pattern and projecting the second pattern produces a desired patterned image on the developable material layer.

2. The method of claim 1, wherein the desired patterned image comprises patterned features with a half-pitch corresponding to a k1 less than or equal to 0.25.

3. The method of claim 1, wherein the developable material layer comprises a wet developable material, or a developable bottom antireflective material, or both a wet developable material and a developable bottom antireflective material.

4. The method of claim 1, further comprising exposing a first patterning device with a beam of radiation to form the first pattern.

5. The method of claim 1, further comprising:
   after projecting the first pattern and before coating the second resist layer, applying a post exposure bake to the substrate having the first pattern on the first resist layer and the developable material layer.

6. The method of claim 1, wherein the lithographic cluster comprises a lithographic apparatus and a coat/develop track system.

7. The method of claim 1, further comprising exposing a second patterning device with a beam of radiation to form the second pattern.

8. The method of claim 1, further comprising:
   after projecting the second pattern, applying a post exposure bake to the substrate having the second pattern on the second resist layer and the developable material layer;
   developing the second resist layer and the developable material layer to form an image of the second pattern in the developable material layer; and
   removing the second resist layer.

9. The method of claim 1, further comprising:
   prior to projecting the second pattern, shifting the substrate in the lithographic cluster by a predetermined distance so as to interleave an image of the second pattern with an image of the first pattern.

10. The method of claim 1, wherein the first pattern and the second pattern are substantially the same.

11. The method of claim 1, wherein a period between features of the first pattern and a period between features of the second pattern is substantially the same.

12. The method of claim 1, wherein features of the first pattern and features of the second pattern are substantially different.

13. The method of claim 1, wherein the first pattern comprises features for printing contact holes, trenches, lines, posts or a combination thereof.

14. The method of claim 1, wherein the second pattern comprises features for printing contact holes, trenches, lines, posts or a combination thereof.

15. The method of claim 1, further comprising:
   coating a third resist layer on top of the developable material layer; and
   projecting a third pattern onto an area of the substrate coated with the developable material layer and the third resist layer,
   wherein projecting the first pattern, projecting the second pattern and projecting the third pattern produces a desired patterned image on the developable material layer.

16. The method of claim 1, further comprising:
   developing the first resist layer and the developable material layer to form an image of the first pattern on the developable material layer; and
   removing the first resist layer.

17. The method of claim 16, wherein removing the first resist layer and coating the second resist layer are performed in a same area of the lithographic cluster.

18. A method for manufacturing a device in a lithographic cluster, comprising:
   projecting a first pattern onto an area of a substrate coated with a developable material layer and a first resist layer;
   projecting a second pattern onto an area of the substrate coated with the developable material layer and a second resist layer, wherein material of or on the substrate immediately beneath the first resist layer and the developable material layer is not etched between projecting the first pattern and projecting the second pattern;
   wherein projecting the first pattern and projecting the second pattern produces a desired patterned image on the developable material layer.

19. The method of claim 18, wherein the desired patterned image comprises patterned features with a half-pitch corresponding to a k1 less than or equal to 0.25.

20. The method of claim 18, wherein the developable material layer comprises a developable bottom antireflective layer.

21. The method of claim 18, further comprising exposing a first patterning device with a beam of radiation to form the first pattern.

22. The method of claim 18, further comprising:
   applying a post exposure bake to the substrate having the first pattern on the first resist layer and the developable material layer;
   developing the first resist layer and the developable material layer to form an image of the first pattern on the developable material layer; and
   removing the first resist layer.

23. The method of claim 18, further comprising exposing a second patterning device with a beam of radiation to form the second pattern.

24. The method of claim 18, further comprising:
   applying a post exposure bake to the substrate having the second pattern on the second resist layer and the developable material layer;

developing the second resist layer and the developable material layer to form an image of the second pattern on the developable material layer; and removing the second resist layer.

25. The method of claim 18, further comprising:

prior to projecting the second pattern, shifting the substrate in the lithographic cluster by a predetermined distance so as to interleave an image of the second pattern with an image of the first pattern.

26. The method of claim 18, wherein the first pattern and the second pattern are substantially the same.

27. The method of claim 18, wherein a period between features of the first pattern and a period between features of the second pattern is substantially the same.

28. The method of claim 18, wherein features of the first pattern and features of the second pattern are substantially different.

29. The method of claim 18, wherein the first pattern comprises features for printing contact holes, trenches, lines, posts or a combination thereof.

30. The method of claim 18, wherein the second pattern comprises features for printing contact holes, trenches, lines, posts or a combination thereof.

31. The method of claim 18, further comprising:

projecting a third pattern onto an area of the substrate coated with the developable material layer and a third resist layer;

wherein the projecting the first pattern, projecting the second pattern and projecting the third pattern produces a desired patterned image on the developable material layer.

* * * * *